(12) United States Patent
Chien et al.

(10) Patent No.: US 9,166,198 B2
(45) Date of Patent: Oct. 20, 2015

(54) OPTICAL FILM AND LIGHT EMITTING DEVICE

(75) Inventors: Pei-Chi Chien, Yilan County (TW); I-Ling Kao, Taipei (TW); Ping-Chen Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/415,845

(22) Filed: Mar. 9, 2012

(65) Prior Publication Data
US 2013/0049573 A1  Feb. 28, 2013

(30) Foreign Application Priority Data

Aug. 25, 2011 (TW) .............................. 100130533 A (51) Int. Cl.
*H05B 33/14* (2006.01)
*B32B 27/08* (2006.01)
(Continued)

(52) U.S. Cl.
CPC .............. *H01L 51/5268* (2013.01); *B32B 3/02* (2013.01); *B32B 5/02* (2013.01); *B32B 5/16* (2013.01); *B32B 5/18* (2013.01); *B32B 27/04* (2013.01); *B32B 27/08* (2013.01); *B32B 27/18* (2013.01); *B32B 27/302* (2013.01); *B32B 27/308* (2013.01); *H01L 51/5275* (2013.01); *B32B 2264/025* (2013.01); *B32B 2264/0235* (2013.01); *B32B 2264/0257* (2013.01); *B32B 2264/0278* (2013.01); *B32B 2264/104* (2013.01);
(Continued)

(58) Field of Classification Search
CPC ................. B32B 2264/025; B32B 2264/0257; B32B 2264/0278; B32B 5/02–5/18; H01L 51/5268–51/5275

USPC ......................................... 313/503, 504, 506
See application file for complete search history.

(56) References Cited

U.S. PATENT DOCUMENTS

| 6,777,871 B2 | 8/2004 | Duggal et al. |
| 7,446,462 B2 | 11/2008 | Lim et al. |

(Continued)

FOREIGN PATENT DOCUMENTS

| CN | 1568435 | 1/2005 |
| CN | 1847955 | 10/2006 |

(Continued)

OTHER PUBLICATIONS

Lin et al., "Improvement of the outcoupling efficiency of an organic light-emitting device by attaching microstructured films", Optics Communications, vol. 275, Jul. 15, 2007, pp. 464-469.

(Continued)

*Primary Examiner* — Sikha Roy
(74) *Attorney, Agent, or Firm* — Jianq Chyun IP Office (57) ABSTRACT

An optical film and a light emitting device are provided. The optical film includes a substrate, a resin layer, and a plurality of porous particles. The resin layer is located on the substrate. The porous particles are distributed in the resin layer, and each of the porous particles includes a particle body and a plurality of holes. A refractive index of the particle body is different from a refractive index of the resin layer, and the refractive index of the particle body is different from a refractive index of air in the holes. The light emitting device includes a light emitting element and an optical film. The light emitting element has a light emitting surface, and the optical film is located on the light emitting surface of the light emitting element.

27 Claims, 4 Drawing Sheets

(51) Int. Cl.

| | | |
|---|---|---|
| *H01L 51/52* | (2006.01) | |
| *B32B 5/02* | (2006.01) | |
| *B32B 5/16* | (2006.01) | |
| *B32B 5/18* | (2006.01) | |
| *B32B 27/04* | (2006.01) | |
| *B32B 27/18* | (2006.01) | |
| *B32B 27/30* | (2006.01) | |
| *B32B 3/02* | (2006.01) | |

(52) U.S. Cl.
CPC ..... *B32B2519/00* (2013.01); *H01L 2251/5369* (2013.01); *Y10T 428/24372* (2015.01); *Y10T 428/24405* (2015.01); *Y10T 428/24413* (2015.01); *Y10T 428/24421* (2015.01)

(56) References Cited

U.S. PATENT DOCUMENTS

| | | | | |
|---|---|---|---|---|
| 7,834,541 | B2 * | 11/2010 | Cok ............................ | 313/504 |
| 8,733,983 | B2 * | 5/2014 | Matsuzaki et al. ............ | 362/332 |
| 2006/0186803 | A1 | 8/2006 | Lim et al. | |
| 2008/0157665 | A1 | 7/2008 | Wu et al. | |
| 2009/0128915 | A1 * | 5/2009 | Weng et al. .................. | 359/601 |
| 2010/0027126 | A1 * | 2/2010 | Chen et al. ................... | 359/601 |

FOREIGN PATENT DOCUMENTS

| | | |
|---|---|---|
| CN | 100383562 | 4/2008 |
| CN | 101796437 | 8/2010 |
| CN | 101887138 | 11/2010 |
| TW | 200734755 | 9/2007 |
| TW | 201116578 | 5/2011 |

OTHER PUBLICATIONS

Eom et al., "Close-packed hemispherical microlens arrays for light extraction enhancement in organic light-emitting devices", Organic Electronics, vol. 12, Jan. 13, 2011, pp. 472~476.

Li et al., "Enhanced light extraction from organic light-emitting devices by using microcontact printed silica colloidal crystals", Organic Electronics, vol. 8, Jun. 13, 2007, pp. 635~639.

"Office Action of Taiwan Counterpart Application", issued on Jul. 22, 2014, p. 1-p. 6, in which the listed references were cited.

"Office Action of China Counterpart Application", issued on May 4, 2014, p. 1-p. 8, in which the listed references were cited.

"Office Action of China Counterpart Application", issued on Apr. 10, 2015, p. 1-p. 9, in which the listed references were cited.

\* cited by examiner

OPTICAL FILM AND LIGHT EMITTING DEVICE

CROSS-REFERENCE TO RELATED APPLICATION

This application claims the priority benefit of Taiwan application serial no. 100130533, filed on Aug. 25, 2011. The entirety of the above-mentioned patent application is hereby incorporated by reference herein and made a part of this specification.

TECHNICAL FIELD

The disclosure relates to an optical film and a light emitting device. More particularly, the disclosure relates to a diffuser and a light emitting device.

BACKGROUND OF THE INVENTION

A normal organic light emitting diode (OLED) device includes a glass substrate, an indium tin oxide (ITO) electrode, an organic light emitting material layer, and a metal electrode. The OLED device contains film layers that are made of materials with different refractive indices, and the significant difference in the refractive indices easily leads to reflection at the interface between the film layers. Said reflection results in the reduction of the overall light emitting efficiency of the OLED device no matter the OLED device is a top-emission OLED device or a bottom-emission OLED device. According to researches, in the normal OLED device, approximately 70%~80% of light loss is attributed to interface reflection, i.e., approximately 70%~80% of light cannot be emitted from the OLED device.

SUMMARY

The disclosure is directed to an optical film. The optical film includes a substrate, a resin layer, and a plurality of porous particles. The resin layer is located on the substrate. The porous particles are distributed in the resin layer. Each of the porous particles includes a particle body and a plurality of holes. A refractive index of the particle body is different from a refractive index of the resin layer, and the refractive index of the particle body is different from a refractive index of air in the holes.

The disclosure is further directed to a light emitting device that includes a light emitting element and an optical film. The light emitting element has a light emitting surface. The optical film is located on the light emitting surface of the light emitting element. Here, the optical film includes a resin layer and a plurality of porous particles distributed in the resin layer. Each of the porous particles includes a particle body and a plurality of holes. A refractive index of the particle body is different from a refractive index of the resin layer, and the refractive index of the particle body is different from a refractive index of air in the holes.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EXEMPLARY EMBODIMENTS

Figure 1:
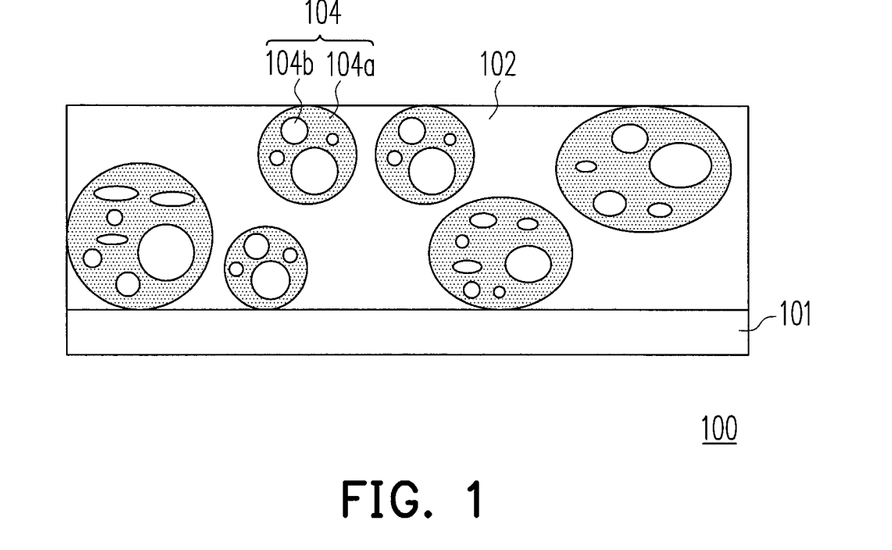
FIG. 1 is a schematic cross-sectional view illustrating an optical film according to an exemplary embodiment of the disclosure.

FIG. 1 is a schematic cross-sectional view illustrating an optical film according to an exemplary embodiment of the disclosure. With reference to FIG. 1, the optical film 100 of this exemplary embodiment includes a substrate 101, a resin layer 102, and a plurality of porous particles 104.

The substrate 101 mainly serves to hold film layers and can be an organic transparent substrate, an inorganic transparent substrate, or a combination thereof. The organic transparent substrate is an organic polyester thin film or a polyimide (PI) thin film, for instance. The inorganic transparent substrate is glass, for instance. The combination of the organic transparent substrate and the inorganic transparent substrate is constituted by stacking the organic transparent substrate and the inorganic transparent substrate. A thickness of the substrate 101 ranges from 30 μm to 300 μm. Normally, the overly thick substrate 101 has low light transmittance, while the overly thin substrate 101 has insufficient mechanical strength.

The resin layer 102 is located on the substrate 101. Here, the resin layer 102 may include a thermoplastic resin material, a photo-curable resin material, or a combination thereof.

The porous particles 104 are distributed in the resin layer 102. Each of the porous particles 104 includes a particle body 104a and a plurality of holes 104b. A material of the particle body 104a includes polystyrene, polymethyl acrylate, methyl methacrylate-styrene copolymer, polycarbonate, polyethylene, silicone resin, calcium carbonate, silicon dioxide, titanium dioxide, or a combination thereof. The holes 104b are formed in the particle body 104a and on the surface of the particle body 104a.

More particularly, in this exemplary embodiment, the refractive index of the resin layer 102 is different from the refractive index of the particle body 104a of each of the porous particles 104. Therefore, when the material of the resin layer 102 and the material of the porous particles 104 are to be determined, it is preferable for the resin layer 102 and the porous particles 104 to be respectively made of materials with different indices. Besides, a weight ratio of the porous particles 104 to the resin layer 102 is 1/99~99/1, preferably 1/6~3/1 and more preferably 1/2~3/2.

According to an exemplary embodiment of the disclosure, the porous particles 104 in the resin layer 102 can be made of the same material. According to another exemplary embodiment of the disclosure, the porous particles 104 in the resin layer 102 can be made of different materials.

In addition, a diameter of each of the porous particles 104 ranges from 0.01 μm to 60 μm in this exemplary embodiment. According to an exemplary embodiment of the disclosure, the porous particles 104 in the resin layer 102 can have the same dimension or similar dimensions. According to another exemplary embodiment of the disclosure, the porous particles 104 in the resin layer 102 can have different dimensions.

Here, the porous particles 104 may be circular particles, irregular particles, or a combination thereof. In an exemplary embodiment of the disclosure, the porous particles 104 in the resin layer 102 can have the same shape or similar shapes. In another exemplary embodiment of the disclosure, the porous particles 104 in the resin layer 102 can have different shapes.

Moreover, in this exemplary embodiment, the resin layer 102 in the optical film 100 can further include an additive. The additive is at least one non-ionic dispersant, at least one surfactant, or a combination thereof, for instance. The non-ionic dispersant contains fluoroaliphatic polymeric esters, for instance. An addition ratio of the additive to the particle ranges from 0.005 wt % to 15 wt %. Adding the non-ionic dispersant or the surfactant into the resin layer 102 may improve dispersion of the porous particles 104 in the resin layer 102, such that the porous particles 104 can be evenly distributed in the resin layer 102.

It should be mentioned that the resin layer 102 that covers the porous particles 104 has a planar upper surface in the exemplary embodiment shown in FIG. 1. Generally, when a mixture of the resin layer 102 and the porous particles 104 is to be made, and the amount of the material of the resin layer 102 is relatively large, the back portion of the substrate 101 can be coated with the mixture, and the porous particles 104 can still be evenly distributed in the layer of the mixture. After a curing process (for removing a solvent of the mixture) is performed to form a cured resin layer 102, the porous particles 104 are still evenly distributed in the resin layer 102, and thus the resin layer 102 can have the planar upper surface.

Figure 2:
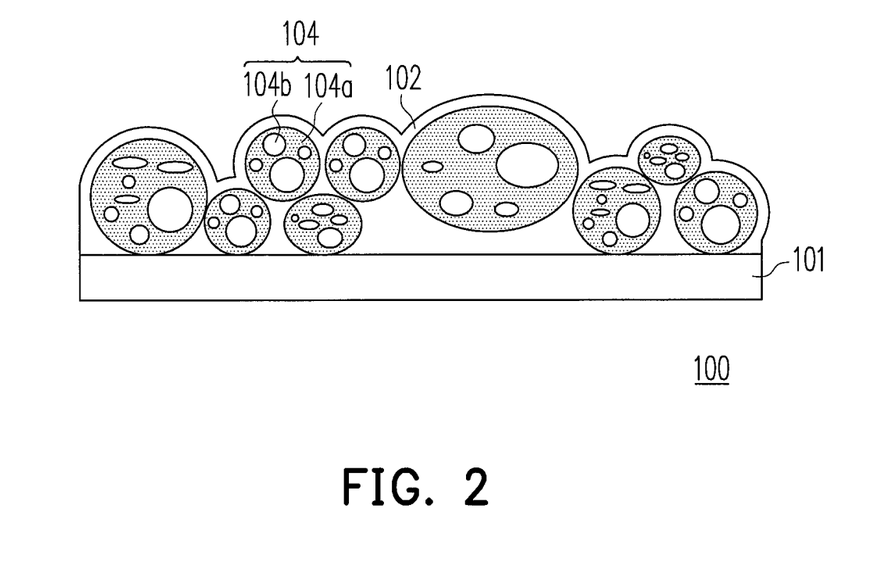
FIG. 2 is a schematic cross-sectional view illustrating an optical film according to another exemplary embodiment of the disclosure.

However, the invention is not limited thereto. In other exemplary embodiments, as indicated in FIG. 2, the resin layer 102 that covers the porous particles 104 has an irregular upper surface. To equip the optical film 100 with the structure shown in FIG. 2, the amount of the material of the resin layer 102 can be relatively small when the mixture of the resin layer 102 and the porous particles 104 is to be made. After the substrate 101 is coated with the mixture, the porous particles 104 are evenly distributed on the substrate 101, and surfaces of the porous particles 104 are covered by the layer of the mixture. A curing process (for removing a solvent of the mixture) is then performed to form a cured resin layer 102, the layer of the mixture on the surfaces of the porous particles 104 is cured as well, so as to form the irregular upper surface of the resin layer 102.

Based on the above, in the optical film 100, the refractive index of the particle body 104*a* of each of the porous particles 104 is different from the refractive index of the resin layer 102, and the refractive index of the particle body 104*a* of each of the porous particles 104 is different from the refractive index of air in the holes 104*b* of the porous particles 104. Hence, when light enters the optical film 100, light is scattered not only because of the different refractive indices of the resin layer 102 and the particle body 104*a* of each porous particle 104 but also because of the different refractive indices of the particle body 104*a* and the air in the holes 104*b* of the porous particles 104. The light passing through the optical film 100 can thus be emitted evenly and efficiently.

The optical film 100 can be applied to various light emitting devices to improve the light emitting efficiency of the light emitting devices. Relevant descriptions are provided below.

Figure 3:
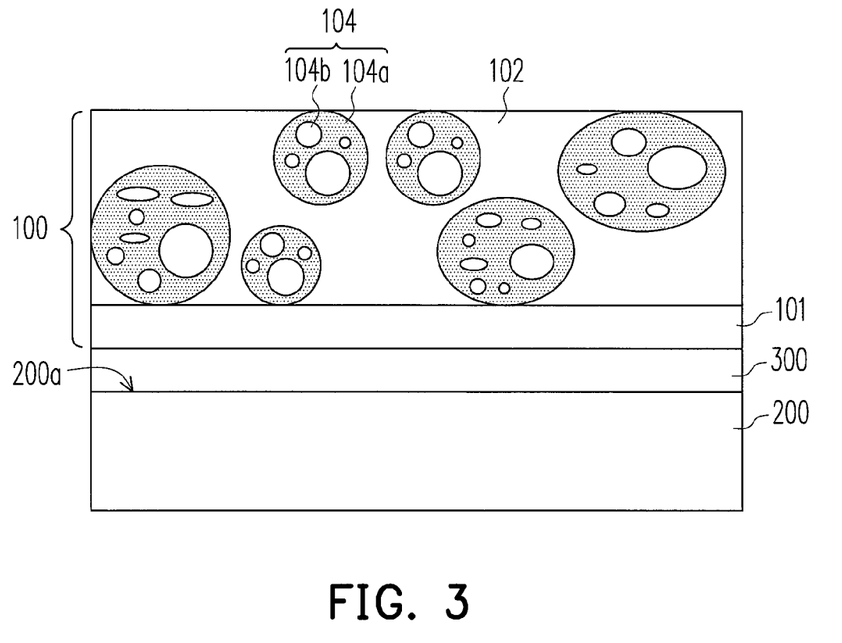
FIG. 3 through FIG. 6 are schematic cross-sectional views illustrating a light emitting device according to several exemplary embodiments of the disclosure.

FIG. 3 is a schematic cross-sectional view illustrating a light emitting device according to an exemplary embodiment of the disclosure. With reference to FIG. 3, the light emitting device of this exemplary embodiment includes a light emitting element 200 and an optical film 100.

The light emitting element 200 can be an organic light emitting diode (OLED) device or a light emitting diode (LED) device. Certainly, the light emitting element 200 can also be any other light emitting device or any other display device, e.g., a liquid crystal display (LCD) device, an electrophoretic display device, an electrowetting display device, and so on. Since the aforesaid light emitting element 200 including the OLED device, the LED device, the LCD device, the electrophoretic display device, the electrowetting display device, or the like is well known, no further description is provided hereinafter.

One surface of the light emitting element 200 is a light emitting surface 200*a*. As exemplarily shown in FIG. 3, the upper surface of the light emitting element 200 is the light emitting surface 200*a*. The optical film 100 is located on the light emitting surface 200*a* of the light emitting device 200, such that the light generated by the light emitting device 200 can pass through the optical film 100.

The optical film 100 is as illustrated in FIG. 1 and includes the substrate 101, the resin layer 102, and the porous particles 104. The materials, the configurations, and the distribution of the substrate 101, the resin layer 102, and the porous particles 104 are discussed in the exemplary embodiment shown in FIG. 1 and thus will not be reiterated hereinafter.

In this exemplary embodiment, an adhesive layer 300 is further configured between the optical film 100 and the light emitting element 200. Namely, the substrate 101 of the optical film 100 is adhered to the light emitting surface 200*a* of the light emitting element 200 through the adhesive layer 300. A material of the adhesive layer 300 includes a transparent adhesive containing propyl, a thermal-curable adhesive, or an ultraviolet-curable adhesive.

Figure 4:
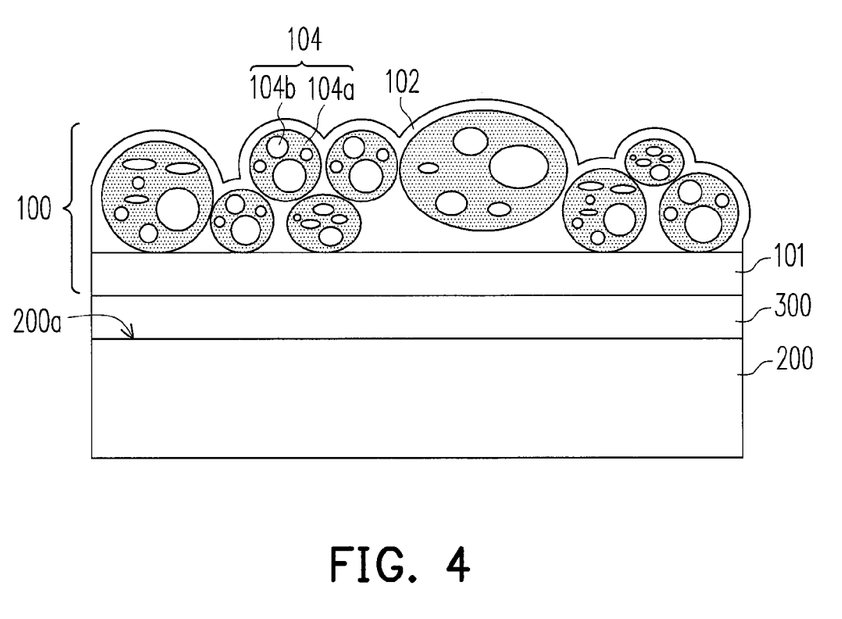

FIG. 4 is a schematic cross-sectional view illustrating a light emitting device according to an exemplary embodiment of the disclosure. With reference to FIG. 4, the exemplary embodiment shown in FIG. 4 is similar to the exemplary embodiment shown in FIG. 3; therefore, the same elements are represented by the same reference numbers and will not be further described. The difference between this exemplary embodiment and the previous embodiment shown in FIG. 3 rests in that the optical film 100 depicted in FIG. 2 is applied in the light emitting device of this exemplary embodiment. That is to say, the resin layer 102 in the optical film 100 has the planar upper surface according to the exemplary embodiment shown in FIG. 3. However, the resin layer 102 in the optical film 100 has the irregular upper surface according to the exemplary embodiment shown in FIG. 4. Similarly, the substrate 101 of the optical film 100 is adhered to the light emitting surface 200*a* of the light emitting element 200 through the adhesive layer 300 in the exemplary embodiment shown in FIG. 4.

Figure 5:
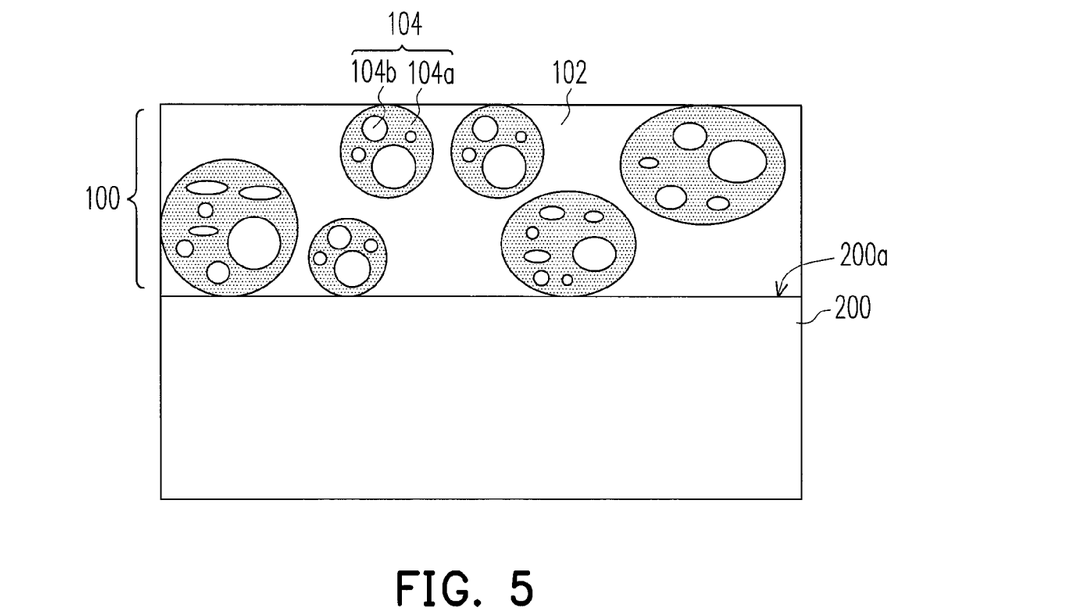

FIG. 5 is a schematic cross-sectional view illustrating a light emitting device according to an exemplary embodiment of the disclosure. With reference to FIG. 5, the light emitting device of this exemplary embodiment includes a light emitting element 200 and an optical film 100.

Similarly, the light emitting element 200 can be an OLED device, an LED device, an LCD device, an electrophoretic display device, an electrowetting display device, or any other light emitting element. Since the aforesaid light emitting element 200 including the OLED device, the LED device, the LCD device, the electrophoretic display device, the electrowetting display device, or the like is well known, no further description is provided hereinafter.

The optical film 100 includes the resin layer 102 and the porous particles 104. Namely, according to this exemplary embodiment, there is no substrate in the optical film 100, and the resin layer 102 and the porous particles 104 are directly formed on the light emitting surface 200a of the light emitting element 200. The materials, the configurations, and the distribution of the substrate 101, the resin layer 102, and the porous particles 104 are discussed in the exemplary embodiment shown in FIG. 1 and thus will not be reiterated hereinafter. A method of directly forming the resin layer 102 and the porous particles 104 on the light emitting surface 200a of the light emitting element 200 includes directly coating the light emitting surface 200a of the light emitting element 200 with the mixture after the mixture of the resin layer 102 and the porous particles 104 is made, for instance. A curing process is performed to remove the solvent in the mixture, and then the mixture can be cured to form the resin layer 102 and the porous particles 104 distributed in the resin layer 102.

In this exemplary embodiment, the resin layer 102 of the optical film 100 and the porous particles 104 are directly formed on the light emitting surface 200a of the light emitting element 200, and therefore no adhesive layer is required for the purpose of adhesion. In comparison with the exemplary embodiments shown in FIG. 3 and FIG. 4, this exemplary embodiment is directed to a simplified fabricating process.

Figure 6:
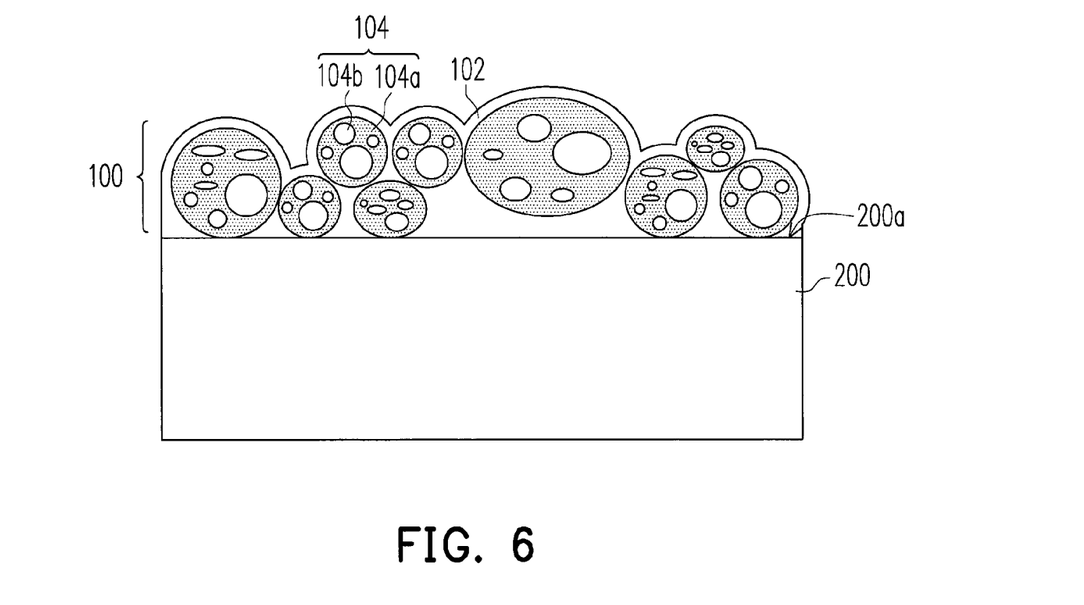

FIG. 6 is a schematic cross-sectional view illustrating a light emitting device according to an exemplary embodiment of the disclosure. With reference to FIG. 6, the exemplary embodiment shown in FIG. 6 is similar to the exemplary embodiment shown in FIG. 5; therefore, the same elements are represented by the same reference numbers and will not be further described. The difference between this exemplary embodiment and the exemplary embodiment shown in FIG. 5 lies in that the resin layer 102 of the optical film 100 has the planar upper surface according to the exemplary embodiment shown in FIG. 5. However, the resin layer 102 of the optical film 100 has the irregular upper surface according to the exemplary embodiment shown in FIG. 6.

As described above, in the light emitting device respectively shown in FIG. 3 to FIG. 6, the optical film 100 has the porous particles 104, the refractive index of the particle body 104a of each porous particle 104 is different from the refractive index of the resin layer 102, and the refractive index of the particle body 104a of each porous particle 104 is different from the refractive index of air in the holes 104b. Accordingly, when light generated by the light emitting element 200 enters the optical film 100, light is scattered not only because of the different refractive indices of the resin layer 102 and the particle body 104a of each porous particle 104 but also because of the different refractive indices of the particle body 104a and the air in the holes 104b of the porous particles 104. In conclusion, the optical film 100 used in the light emitting device can enhance the overall light emitting efficiency and the light emitting uniformity of the light emitting device.

Experimental Examples

The following examples 1~4 are provided to evidence that the optical film described in the exemplary embodiment can indeed improve the light emitting efficiency. In the examples 1~4, the method of forming the optical film includes following steps. A mixture is provided. The mixture is made by mixing and well stirring a fluorine surfactant named FC4432 (produced by 3M), toluene, isopropanol (IPA), solid particles SBX12 (produced by SEKISUI CHEMICAL Co. Ltd.) having diameters of 1 μm~20 μm, and polystyrene porous particles named XX1352 (produced by SEKISUI CHEMICAL Co. Ltd.). Acrylic resin (RI=1.48) is then added to the mixed solution, and the mixed solution is stirred to form the aforesaid mixture. A polyethylene terephthalate (PET) substrate having the thickness of 188 μm is then coated with the mixture. A desiccation process is then performed at 100° C. to remove the solvent, so as to form the optical film described in the examples 1~4.

In the mixture discussed in the examples 1~4, the ratio of particles (solid particles and porous particles) to resin is 0.83, the ratio of resin/toluene/IPA is 4/9/2, the weight ratio of the surfactant FC4432 to the particles (solid particles and porous particles) is 0.042, and the PET substrate is coated with the mixture having the thickness of 22 μm~25 μm. However, the difference among the examples 1~4 lies in that the weight ratio of the porous particles to all the particles (solid particles and porous particles) is 1, 0.6, 0.2, and 0, respectively.

A test method for obtaining the light-outcoupling gain (i.e., the light emitting efficiency) of the optical film in the examples 1~4 is described below. The optical film applied in the examples 1~4 is adhered to the light emitting surface of the light emitting element through an optical adhesive. Here, the optical adhesive refers to an OTA-050 propyl adhesive produced by Alliance Material Company (AMC) and having the thickness of 50 μm and RI=1.478, and the light emitting element refers to the OLED device produced by OSRAM AG. After that, the luminance is measured, and the light-outcoupling gain (i.e., the light emitting efficiency) is calculated. The results of calculating the light-outcoupling gain (i.e., the light emitting efficiency) after the optical film of the examples 1~4 is adhered to the OLED device are shown in Table 1.

TABLE 1

|  | Weight ratio of particles/ resin | Weight ratio of porous particles to all particles | Ratio of Resin/ toluene/ IPA | Ratio of surfactant (FC4432)/ particles | Film thickness | gain (%) |
| --- | --- | --- | --- | --- | --- | --- |
| Example 1 | 0.83 | 1 | 4/9/2 | 0.042 | 22 μm-25 μm | 47.24 |
| Example 2 | 0.83 | 0.6 | 4/9/2 | 0.042 | 22 μm-28 μm | 43.00 |
| Example 3 | 0.83 | 0.2 | 4/9/2 | 0.042 | 22 μm-25 μm | 37.55 |
| Example 4 | 0.83 | 0 | 4/9/2 | 0.042 | 22 μm-25 μm | 30.55 |

Figure 7:
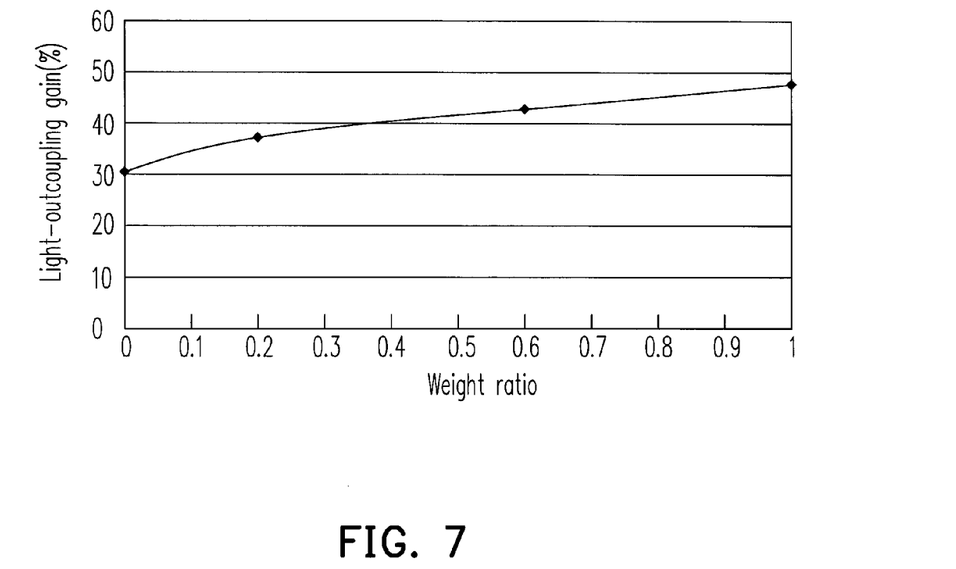
FIG. 7 shows a correlation between a weight ratio of porous particles and a light-outcoupling gain.

As indicated in the example 4 in Table 1, when the ratio of the porous particles to all the particles is zero, i.e., all of the particles are solid particles, the calculated light-outcoupling gain has the smallest value (30.55%). As the ratio of the porous particles to all the particles increases, the calculated light-outcoupling gain correspondingly increases (37.55%~47.24%). The correlation between the weight ratio of the porous particles to all the particles and the light-outcoupling gain is also indicated in FIG. 7.

As indicated above, when the optical film (example 1) having the porous particles is applied, the light emitting efficiency of the OLED device can be increased by 50%. Given that the dimensions of the particles are the same, and that the resin and the particles are made of the same material, the optical film merely having the solid particles (example 4) is compared with the optical film having the porous particles, so as to obtain the result that the light emitting efficiency of the optical film having the porous particles is greater than the light emitting efficiency of the optical film merely containing the solid particles by 17%. In addition, according to the results of examples 1~4, the more the porous particles, the greater the light-outcoupling gain of the optical film.

Figure 8:
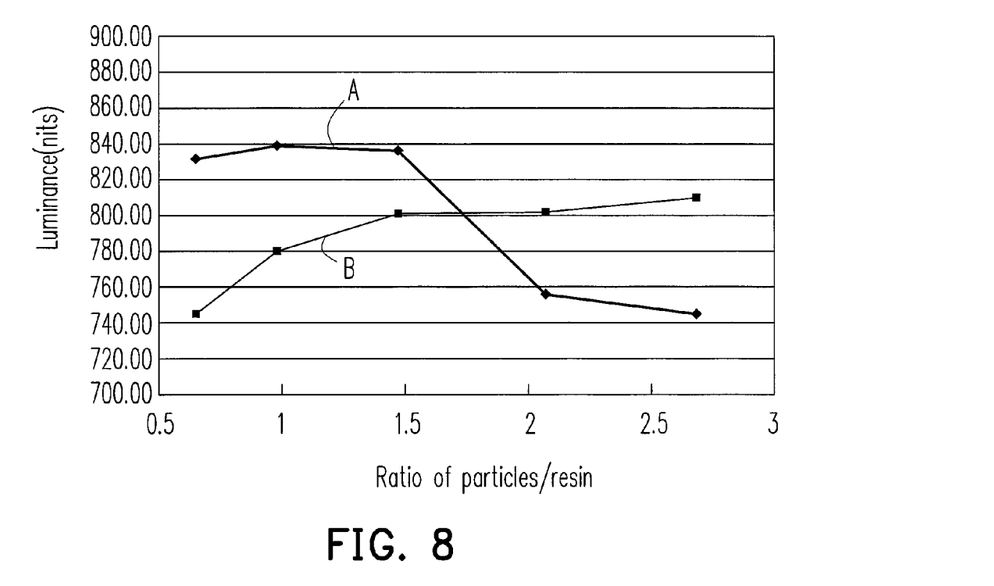
FIG. 8 shows a correlation between a ratio of particles/resin and luminance of a light emitting device.

FIG. 8 shows a correlation between a ratio of particles/resin and luminance of a light emitting device. With reference to FIG. 8, the horizontal axis represents the ratio of particles/resin, and the vertical axis denotes the luminance of the light emitting device. In FIG. 8, the curve A represents the correlation between the ratio of particles/resin and the luminance of the light emitting device when the porous particles XX1352 are applied. The curve B represents the correlation between the ratio of solid particles/resin and the luminance of the light emitting device when the solid particles SBX12 are applied. As indicated in FIG. 8, when the ratio of the porous particles XX1352 in the optical film increases, the luminance of the light emitting device gradually reaches the maximum value and then decreases (curve A). By contrast, when the ratio of the solid particles SBX12 in the optical film increases, the luminance of the light emitting device gradually increases and then reaches a saturated state (curve B). However, after comparing the curve A with the curve B, it can be learned that the light emitting device in which the optical film containing the porous particles XX1352 is applied can have optimal luminance when the ratio of particles/resin is equal to or smaller than 1.7.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An optical film comprising:
a substrate;
a resin layer located on the substrate;
a plurality of porous particles distributed in the resin layer, each of the porous particles comprising a particle body and a plurality of holes fully filled with air, wherein each of the holes are located inside of the particle body, a refractive index of the particle body is different from a refractive index of the resin layer, and the refractive index of the particle body is different from a refractive index of air in the holes.

2. The optical film as recited in claim 1, wherein the resin layer covering the porous particles has a planar upper surface or an irregular upper surface.

3. The optical film as recited in claim 1, wherein a material of the particle body of each of the porous particles comprises polystyrene, polymethyl acrylate, methyl methacrylate-styrene copolymer, polycarbonate, polyethylene, silicone resin, calcium carbonate, silicon dioxide, titanium dioxide, or a combination thereof.

4. The optical film as recited in claim 1, wherein the resin layer comprises a thermoplastic resin material, a photo-curable resin material, or a combination thereof.

5. The optical film as recited in claim 1, wherein a diameter of each of the porous particles ranges from 0.01 μm to 60 μm.

6. The optical film as recited in claim 1, wherein the porous particles are circular particles, irregular particles, or a combination thereof.

7. The optical film as recited in claim 1, wherein a weight ratio of the porous particles to the resin layer is 1/99~99/1.

8. The optical film as recited in claim 1, further comprising an additive.

9. The optical film as recited in claim 8, wherein the additive comprises at least one non-ionic dispersant, at least one surfactant, or a combination thereof.

10. The optical film as recited in claim 9, wherein an addition ratio of the additive to the particle ranges from 0.005 wt % to 15 wt %.

11. The optical film as recited in claim 1, wherein the substrate is an organic transparent substrate, an inorganic transparent substrate, or a combination thereof.

12. The optical film as recited in claim 1, wherein a thickness of the substrate ranges from 30 μm to 300 μm.

13. A light emitting device comprising:
a light emitting element having a light emitting surface; and
an optical film located on the light emitting surface of the light emitting element and comprising:
a resin layer; and
a plurality of porous particles distributed in the resin layer, each of the porous particles comprising a particle body and a plurality of holes fully filled with air, wherein each of the holes are located inside of the particle body, a refractive index of the particle body is different from a refractive index of the resin layer, and the refractive index of the particle body is different from a refractive index of air in the holes.

14. The light emitting device as recited in claim 13, wherein the resin layer is in physical contact with the light emitting surface of the light emitting element.

15. The light emitting device as recited in claim 13, wherein the optical film further comprises a substrate, and the resin layer is located on the substrate.

16. The light emitting device as recited in claim 15, further comprising an adhesive layer located between the substrate and the light emitting surface of the light emitting element.

17. The light emitting device as recited in claim 16, wherein the adhesive layer comprises a transparent adhesive containing propyl, a thermal-curable adhesive, or an ultraviolet-curable adhesive.

18. The light emitting device as recited in claim 13, wherein the resin layer covering the porous particles has a planar upper surface or an irregular upper surface.

19. The light emitting device as recited in claim 13, wherein a material of the particle body of each of the porous particles comprises polystyrene, polymethyl acrylate, methyl methacrylate-styrene copolymer, polycarbonate, polyethylene, silicone resin, calcium carbonate, silicon dioxide, titanium dioxide, or a combination thereof.

20. The light emitting device as recited in claim 13, wherein the resin layer comprises a thermoplastic resin material, a photo-curable resin material, or a combination thereof.

21. The light emitting device as recited in claim 13, wherein a diameter of each of the porous particles ranges from 0.01 μm to 60 μm.

22. The light emitting device as recited in claim 13, wherein the porous particles are circular particles, irregular particles, or a combination thereof.

23. The light emitting device as recited in claim 13, wherein a ratio of the porous particles to the resin layer is 1/99~99/1.

24. The light emitting device as recited in claim 13, further comprising an additive.

25. The light emitting device as recited in claim 24, wherein the additive comprises at least one non-ionic dispersant, at least one surfactant, or a combination thereof.

26. The light emitting device as recited in claim 25, wherein an addition ratio of the additive to the particle ranges from 0.005 wt % to 15 wt %.

27. The light emitting device as recited in claim 13, wherein the light emitting element comprises an organic light emitting diode device or a light emitting diode device.

* * * * *